United States Patent
Watts et al.

(10) Patent No.: US 8,796,796 B2
(45) Date of Patent: Aug. 5, 2014

(54) METHOD AND SYSTEM FOR PROVIDING MAGNETIC JUNCTIONS HAVING IMPROVED POLARIZATION ENHANCEMENT AND REFERENCE LAYERS

(71) Applicants: Steven M. Watts, Mountain View, CA (US); Kiseok Moon, Pleasanton, CA (US)

(72) Inventors: Steven M. Watts, Mountain View, CA (US); Kiseok Moon, Pleasanton, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 41 days.

(21) Appl. No.: 13/721,214

(22) Filed: Dec. 20, 2012

(65) Prior Publication Data
US 2014/0175574 A1    Jun. 26, 2014

(51) Int. Cl.
H01L 29/82    (2006.01)

(52) U.S. Cl.
USPC .... 257/421; 257/422; 257/427; 257/E29.323; 438/3; 365/157; 365/158

(58) Field of Classification Search
USPC ........ 257/20, 414, 421–427, E29.323; 438/3; 365/157–158
See application file for complete search history.

(56) References Cited

U.S. PATENT DOCUMENTS

| | | | |
|---|---|---|---|
| 2010/0039106 A1* | 2/2010 | Edelstein | 324/253 |
| 2010/0096716 A1* | 4/2010 | Ranjan et al. | 257/421 |
| 2010/0178528 A1 | 7/2010 | Tsunekawa et al. | |
| 2011/0062956 A1* | 3/2011 | Edelstein | 324/251 |
| 2011/0149647 A1 | 6/2011 | Kim et al. | |
| 2011/0241139 A1 | 10/2011 | Yen et al. | |
| 2011/0260272 A1 | 10/2011 | Lee et al. | |
| 2012/0012952 A1 | 1/2012 | Chen et al. | |
| 2012/0018825 A1 | 1/2012 | Lim et al. | |
| 2012/0104522 A1* | 5/2012 | Jung et al. | 257/421 |
| 2012/0175716 A1* | 7/2012 | Bessho et al. | 257/421 |
| 2013/0177781 A1* | 7/2013 | Chepulskyy et al. | 428/811.1 |

* cited by examiner

*Primary Examiner* — Jami M Valentine
(74) *Attorney, Agent, or Firm* — Convergent Law Group LLP

(57) ABSTRACT

A magnetic junction is provided. The magnetic junction includes a reference stack, a nonmagnetic spacer layer and a free layer. The reference stack includes a high perpendicular magnetic anisotropy (PMA) layer and a graded polarization enhancement layer (PEL) between the high PMA and nonmagnetic spacer layers. The PEL is magnetically coupled with the reference layer. The PEL includes magnetic layers and nonmagnetic insertion layers. At least part of the PEL has a spin polarization greater than the PMA layer's. The nonmagnetic insertion layers are configured such that the magnetic layers are ferromagnetically coupled and the crystalline orientations of the high PMA and nonmagnetic spacer layers are decoupled. Each nonmagnetic insertion layer's thickness is insufficient for the crystalline orientations to be decoupled in the absence of the remaining nonmagnetic insertion layers. The free layer is switchable between stable magnetic states when a write current is passed through the magnetic junction.

36 Claims, 6 Drawing Sheets

METHOD AND SYSTEM FOR PROVIDING MAGNETIC JUNCTIONS HAVING IMPROVED POLARIZATION ENHANCEMENT AND REFERENCE LAYERS

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11 and uses conventional seed layer(s) 12. The conventional MTJ 10 includes a conventional free layer 14, a conventional tunneling barrier layer 16, a conventional polarization enhancement layer (PEL) 18, a conventional reference layer 22 and a conventional capping layer 26. Also shown is top contact 28. The conventional PEL 18, conventional Ta spacer layer 20 and conventional reference layer 22 may be considered to form a conventional reference stack.

Conventional contacts 11 and 28 are used in driving the current in a current-perpendicular-to-plane (CPP) direction, or along the z-axis as shown in FIG. 1. The conventional seed layer(s) 12 are typically utilized to aid in the growth of subsequent layers having a desired crystal structure. The conventional tunneling barrier layer 18 is nonmagnetic and is, for example, a thin insulator such as MgO.

The magnetic moments of the conventional free layer 14 and the conventional reference layer 22 are substantially perpendicular to plane (i.e. in the z-direction). The reference layer 22 is a synthetic antiferromagnet (SAF) that includes two magnetic layers 23 and 25 separated by a nonmagnetic layer 24 that mediates an RKKY interaction. The nonmagnetic layer 24 is typically Ru. The layers 23 and 25 are antiferromagnetically coupled through the Ru layer 24, which reduces the external field at the free layer 14. The perpendicular magnetic anisotropy, $H_k$, of the layers 23 and 25 and the free layer 14 exceeds the out-of-plane demagnetization energy of the layers 23, 25, and 14, respectively. Thus, their magnetic moments are perpendicular as shown in FIG. 1. Typically, the magnetic layers 23 and 25 are actually multilayers including both Co layers and Pt or Pd layers. For example, the magnetic layers 23 and 25 may include a CoPd multilayer (layers of Co interleaved with layers of Pd), a CoPt multilayer (Co layers interleaved with Pt layers), or both. In addition, other constituents such as additional co and/or Fe layers may be included. These magnetic multilayers have a perpendicular anisotropy that is sufficient for the reference layer 22 to remain stable during use of the magnetic junction 10. In contrast, the magnetic moment of the conventional free layer 14 is changeable. This is represented by the dual headed arrow 15 in FIG. 1.

The conventional PEL layer 18 enhances the spin polarization of a current passing in the perpendicular (e.g. z) direction. The conventional PEL typically consists of magnetic materials. For example, a CoFeB layer, an Fe layer, or a CoFeB layer adjoining an Fe layer are typically used. The conventional PEL layer 18 is magnetically coupled with the reference layer 22 in order to ensure the magnetic stability of the conventional PEL 18.

For the conventional magnetic junction 10, a high signal is desired. Thus, the tunneling magnetoresistance (TMR) is desired to be large. A large TMR is generally associated with a high quality conventional tunneling barrier 16. The conventional tunneling barrier 16 is typically crystalline MgO with a (100) orientation. In addition, a relatively small lattice mismatch between the MgO and adjoining ferromagnetic layers 14 and 18 is desired to maintain the perpendicular anisotropy of the layers 14 and 18. For example, CoFeB or Fe are typically used for the layers 14 and 18.

The conventional Ta spacer layer 20 is used to ensure that the conventional reference layer 23 and conventional PEL 18 have independent crystalline orientations. The conventional Ta spacer layer 20 also reduces the pinning field between the layers 18 and 23. In addition, the conventional Ta spacer layer may prevent diffusion of materials, such as Ru and Pd, from the reference layer 22 to other layers of the magnetic junction 10. More specifically, the Ta spacer layer 20 prevents diffusion of Ru and Pd from the layer 24 to the tunneling barrier layer 16. Diffusion of Ru and/or Pd into the tunneling barrier layer adversely affects the TMR of the conventional magnetic junction 10. It is believed that the diffusion of Ru degrade the MgO layer 16 and cause the MgO layer 16 to have a crystalline orientation other than the desired (100) texture. The conventional Ta spacer layer 20 thus has a thickness that is at least sufficient to prevent diffusion of materials such as Ru and Pd from the reference layer 22 to the PEL layer 18 and the MgO tunneling barrier layer 16. It is believed that the conventional Ta spacer layer 20 is at least four Angstroms thick in order to function as a diffusion barrier. In the conventional magnetic junction 10 shown, the conventional Ta spacer layer 20 also allows for magnetic coupling, such as RKKY coupling, between the PEL 18 and the magnetic layer 23.

To switch the magnetization 15 of the conventional free layer 14, a current is driven perpendicular to plane (in the z-direction). When a sufficient current is driven from the top contact 28 to the bottom contact 11, the magnetization 15 of the conventional free layer 14 may switch to be parallel to the magnetization 18 of the conventional PEL 18. When a sufficient current is driven from the bottom contact 11 to the top contact 28, the magnetization 15 of the free layer 14 may switch to be antiparallel to that of the PEL layer 18. The differences in magnetic configurations correspond to different magnetoresistances and thus different logical states (e.g. a logical "0" and a logical "1") of the conventional MTJ 10. Thus, by reading the tunneling magnetoresistance (TMR) of the conventional MTJ 10 the state of the conventional MTJ can be determined, Although the conventional MTJ 10 may be written using spin transfer, read by sensing the TMR of the junction, and used in an STT-RAM, there are drawbacks. In particular, the stability or TMR of the conventional MTJ 10 may be poorer than is desired. The conventional PEL 18 may be magnetically coupled to the conventional magnetic layer 23 through the conventional Ta spacer layer 20. However, it is well known that this coupling through Ta may be relatively weak. For example, the RKKY coupling of Ta is expected to be orders of magnitude less than that for Ru. In addition, it is believed that the coupling through the Ta spacer layer 20 is due to a mechanism such as pinhole or orange peel. Such a coupling mechanism is unpredictable and may vary across a wafer. This may result in variation between individual memory cells in a magnetic memory. Although thermally stable, the conventional PEL 18 may have its magnetic moment switch direction during operation of the magnetic junction. Stated differently, the magnetic moment of the conventional PEL 18 may not be as stable as desired for some of the conventional magnetic junctions 10 in a particular magnetic memory. As a result, performance of the conventional MTJ may be adversely affected.

Accordingly, what is needed is a method and system that may improve the performance of the spin transfer torque based memories. The method and system described herein address such a need.

BRIEF SUMMARY OF THE INVENTION

A method and system provide a magnetic junction usable in a magnetic device. The magnetic junction includes a reference stack, a nonmagnetic spacer layer and a free layer. The free layer magnetic moment is perpendicular-to-plane. The nonmagnetic spacer layer is between the PEL and free layer and has a first crystalline orientation. The reference stack includes a high perpendicular magnetic anisotropy (PMA) layer and a graded polarization enhancement layer (PEL). The high PMA layer has a perpendicular-to-plane magnetic moment, a second crystalline orientation and a first spin polarization. The graded PEL is between the high PMA layer and the nonmagnetic spacer layer. The graded PEL is also adjacent to and magnetically coupled with the reference layer. The PEL includes magnetic layers and nonmagnetic insertion layers. At least part of the PEL has a spin polarization greater than the first spin polarization and is adjacent to the nonmagnetic spacer layer. Each of the nonmagnetic insertion layers is configured such that the magnetic layers are ferromagnetically coupled and such that the first crystalline orientation is decoupled from the second crystalline orientation. Each nonmagnetic insertion layer has a thickness insufficient for the crystalline orientations to be decoupled in the absence of the remaining nonmagnetic insertion layers. The free layer is switchable between stable magnetic states when a write current is passed through the magnetic junction.

DETAILED DESCRIPTION OF THE INVENTION

Figure 1:
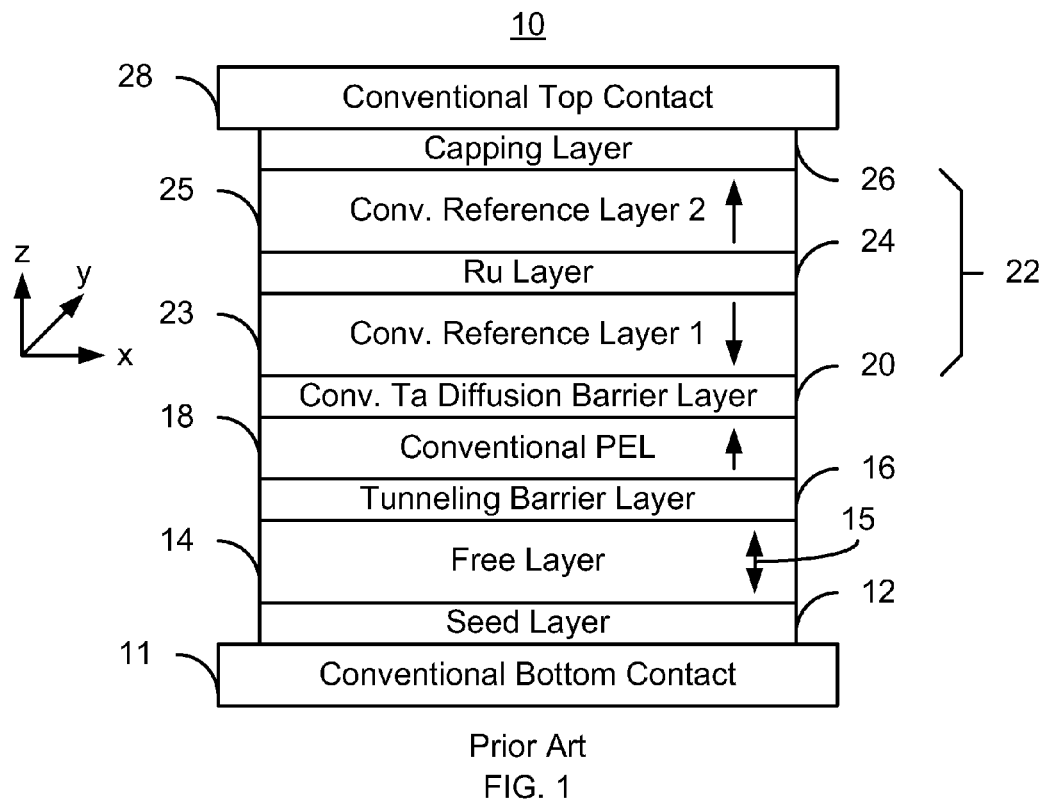
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide a magnetic junction usable in a magnetic device. The magnetic junction includes a reference stack, a nonmagnetic spacer layer and a free layer. The free layer magnetic moment is perpendicular-to-plane. The nonmagnetic spacer layer is between the PEL and free layer and has a first crystalline orientation. The reference stack includes a high perpendicular magnetic anisotropy (PMA) layer and a graded polarization enhancement layer (PEL). The high PMA layer has a perpendicular-to-plane magnetic moment, a second crystalline orientation and a first spin polarization. The graded PEL is between the high PMA layer and the nonmagnetic spacer layer. The graded PEL is also adjacent to and magnetically coupled with the reference layer. The PEL includes magnetic layers and nonmagnetic insertion layers. At least part of the PEL has a spin polarization greater than the first spin polarization and is adjacent to the nonmagnetic spacer layer. Each of the nonmagnetic insertion layers is configured such that the magnetic layers are ferromagnetically coupled and such that the first crystalline orientation is decoupled from the second crystalline orientation. The free layer is switchable between stable magnetic states when a write current is passed through the magnetic junction. In some embodiments, each of the nonmagnetic insertion layers is sufficiently thin that a single nonmagnetic insertion layer alone would not function as a diffusion barrier and/or would not allow for a crystallographic transition between the nonmagnetic spacer layer and the high PMA layer.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
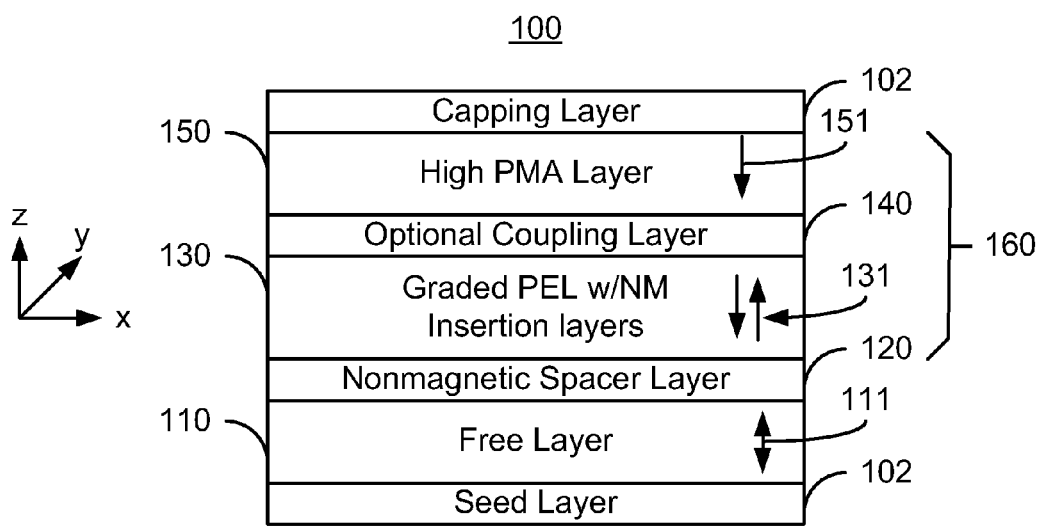
FIG. 2 depicts an exemplary embodiment of a magnetic junction including a graded PEL having nonmagnetic insertion layers and being switchable using spin transfer.

FIG. 2 depicts an exemplary embodiment of a magnetic junction 100 including a PEL having nonmagnetic insertion layers and being switchable using spin transfer. The magnetic junction may be used in a magnetic memory such as an STT-RAM. For clarity, FIG. 2 is not to scale. The magnetic junction 100 a free layer 110, a nonmagnetic spacer layer 120 and a reference stack 160. The reference stack 160 includes a graded PEL 130, an optional coupling layer 140 and a high perpendicular magnetic anisotropy (PMA) layer 150. The magnetic moment of the high PMA layer 150 is desired to be perpendicular-to-plane. Thus, as used herein, a high PMA layer is a layer for which the perpendicular magnetic anisotropies exceed the out-of-plane demagnetization energy. Although termed a high PMA layer, in alternate embodiments, the magnetic moment of the layer 150 may be in plane. Although layers 110, 120, 130, 140 and 150 are shown with a particular orientation, this orientation may vary in other embodiments. For example, the high PMA layer 150 may be closer to the bottom (closets to a substrate that is not shown) of the magnetic junction 100. Also shown are optional seed layer 102 and optional capping layer 104. The seed layer 102 may include multiple layers including but not limited to a Ta/RuCoFe bilayer. The capping layer 104 may be a Ru and/or Ta capping layer. In other embodiments, the capping layer 104 may be another material. A pinning layer (not shown) may also be used. In general, the pinning layer would be used if the magnetic moment of the high PMA layer 150 is in plane but would generally not be used if the magnetic moment of the high PMA layer 150 is perpendicular to plane. In a preferred embodiment, the magnetic moments 111, 131 and 151 are perpendicular to plane and no pinning layer is used. The perpendicular magnetic anisotropies, $H_k$, of the free layer 110, graded PEL 130 and high PMA layer 150 exceed the out-of-plane demagnetization energies of the layers 110, 130 and 150, respectively. Thus, their magnetic moments are perpendicular as shown in FIG. 2. The magnetic moment 111 of the free layer 110 is changeable and thus indicated by a double arrow. The graded PEL 130 has a magnetic moment 131 that is substantially fixed by a magnetic coupling with the high PMA layer 150. However, the direction in which the magnetic moment 131 is fixed depends upon whether the layers 130 and 150 are ferromagnetically coupled or antiferromagnetically coupled. Thus, two arrows 131 in opposite directions are shown in FIG. 2. Although the high PMA layer 150 is shown with magnetic moment 151 in a particular direction, in other embodiments, the magnetic moment 151 may be in another direction including but not limited to the positive z-direction. The magnetic junction 100 is also configured to allow the free layer 110 to be switched between stable magnetic states using a write current passed in a CPP direction through the magnetic junction 100. Thus, the free layer 110 is switchable utilizing spin transfer torque. In some embodiments, the free layer 110 is switched using only spin transfer torque. In other embodiments, the free layer 110 may be switched using an additional mechanism including but not limited to an applied magnetic field.

The nonmagnetic spacer layer 120 may be a tunneling barrier layer, conductor, or other structure for which magnetoresistance is exhibited between the free layer 110 and the high PMA layer 150. In some embodiments, the nonmagnetic spacer layer 120 is a crystalline MgO tunneling barrier layer. In such embodiments, the crystalline MgO tunneling barrier layer 120 is generally desired to have a (100) orientation/texture. In other embodiments, the nonmagnetic spacer layer 120 may be a conductor, may include conductive channels in an insulating matrix, or may have another structure. Thus, the magnetic junction 100 may be a MTJ, spin valve, ballistic magnetoresistance structure, another magnetoresistive structure, or some combination thereof.

Although depicted as simple layers, the free layer 110 and/or the high PMA layer 150 may include multiple layers. For example, the free layer 110 and/or the high PMA layer 150 may be a SAF including magnetic layers antiferromagnetically or ferromagnetically coupled through thin layers, such as Ru. In such a SAF, multiple magnetic layers interleaved with thin layer(s) of Ru or other material(s) may be used. In some embodiments, the high PMA layer 150 is particularly desired to be a SAF to reduce the external field on the free layer 110. The free layer 110 and/or the high PMA layer 150 may also include other multilayer(s) and/or superlattices. For example, the free layer 110 and/or the high PMA layer 150 may include a CoPd and/or CoPt multilayer having enhanced perpendicular anisotropy. Alternatively, the free layer 110 and/or the high PMA layer 150 may include a CoPd or CoPt superlattice, which is compositional CoPd and/or CoPt rather than a multilayer. Further, if the high PMA layer 150 and/or the free layer 110 is a SAF, one or more of the magnetic layers in the SAF may be a CoPd and/or CoPt multilayer or superlattice. Thus, the layers 110 and 150 may include layers of Co interleaved with layers of Pd, Co layers interleaved with Pt layers, or both. In addition, other constituents such as additional Co and/or Fe layers may be included. These magnetic multilayers have a perpendicular anisotropy that is sufficient for the high PMA layer 150 to remain stable during use of the magnetic junction 100. The high PMA layer 150 also has a spin polarization particular to the materials used in the high PMA layer 150.

The optional coupling layer 140 is a nonmagnetic layer that may or may not be included in the magnetic junction 100. For example, the optional coupling layer 140 may be a Ru layer that mediates an RKKY interaction between the high PMA layer 150 and the graded PEL 130. In some embodiments, the thickness of the optional coupling layer 140 may be tailored to produce either one of a ferromagnetic interaction and an antiferromagnetic interaction between the high PMA layer 150 and the graded PEL 130. Thus, the magnetic moment 131 of the graded PEL 130 is shown as being either parallel or antiparallel to the magnetic moment 151 of the high PMA layer 150. In other embodiments, the optional coupling layer 140 may be omitted. In such embodiments, the graded PEL 130 may be ferromagnetically coupled with the high PMA layer 150. In such embodiments, a magnetic layer (not shown in FIG. 2) in the graded PEL 130 may adjoin (i.e. share an interface with) the high PMA layer 150. In other embodiments, the graded PEL 130 is antiferromagnetically coupled with the high PMA layer 150. In such embodiments, a nonmagnetic layer (not shown in FIG. 2) within the graded PEL 130 may adjoin the high PMA layer 150.

The graded PEL 130 is magnetically coupled with the high PMA layer 150 directly or through the optional coupling layer 140. The graded PEL 130 includes multiple ferromagnetic layers interleaved with multiple nonmagnetic insertion layers. For simplicity, the individual sublayers are not shown in FIG. 2. At least part of the graded PEL 130 has a spin polarization greater than the spin polarization of the high PMA layer. In some embodiments, at least the portion of the graded PEL 130 adjoining the nonmagnetic spacer layer 120 has this higher spin polarization. As mentioned above, the graded PEL 130 includes magnetic layers and nonmagnetic layers. At least part of the magnetic layer adjoining the nonmagnetic spacer layer 120 has the higher spin polarization than the high PMA layer 150. In some embodiments, the entire magnetic layer adjoining (or sharing an interface with) the nonmagnetic spacer layer 120 has the higher spin polarization. For example, CoFeB having not more than forty atomic percent B may be used. In some embodiments, the CoFeB may have at least ten and not more than twenty atomic percent B. The remaining magnetic layers may or may not have this higher spin polarization. Thus, remaining the magnetic layers in the graded PEL 130 may be made of the same or another material.

In addition to the magnetic layers, the graded PEL 130 includes nonmagnetic insertion layers. In some embodiments, each of the nonmagnetic insertion layers includes Ta. In some such embodiments, each of the nonmagnetic insertion layers consists of Ta. The nonmagnetic insertion layers may be used to decouple the crystalline orientation of the high PMA layer 150 from that of the nonmagnetic spacer layer 120. For example, Ta is amorphous for some thicknesses. Such an amorphous layer may disrupt the imposition of the crystal order of the high PMA layer 150 on the nonmagnetic spacer layer 120, and vice versa. Each of the nonmagnetic insertion layers has a thickness that is smaller than that which would be required for a single nonmagnetic insertion layer to block the imposition of crystalline order from the high PMA layer 150 to the nonmagnetic spacer layer. Thus, the thickness of each of the insertion layers is insufficient for the crystalline decoupling between the high PMA layer 150 and the nonmagnetic spacer layer 120. However, the sum of the thicknesses for all of the nonmagnetic insertion layers is sufficient to disrupt the imposition of crystal order of the high PMA layer 150 on the nonmagnetic spacer layer 120. As such, the high PMA layer 150 may have a first crystalline orientation while the nonmagnetic spacer layer 120 has a second, different crystalline orientation.

The nonmagnetic insertion layers may also be used to block diffusion of materials such as Pd and/or Ru from the high PMA layer 150 to the nonmagnetic spacer layer 120. If the optional magnetic coupling layer 140 is included, the nonmagnetic insertion layers are also used to block diffusion of material(s) such as Ru from the optional magnetic coupling layer 140 to the nonmagnetic spacer layer 120. However, each of the nonmagnetic insertion layers has a thickness that is smaller than that which would be required for a single nonmagnetic insertion layer to block diffusion between the high PMA layer 150 and the nonmagnetic spacer layer. Thus, the thickness of each of the insertion layers is insufficient for the diffusion blocking between the high PMA layer 150 and the nonmagnetic spacer layer 120. In some embodiments, the thickness of each nonmagnetic insertion layer is at least two Angstroms but less than three Angstroms. For nonmagnetic insertion layers consisting of Ta, the thickness of each layer is thus less than three Angstroms. However, the sum of the thicknesses for all of the nonmagnetic insertion layers is sufficient to provide diffusion blocking between the high PMA layer 150 and the nonmagnetic spacer layer 120. For nonmagnetic insertion layers consisting of Ta, this means that the sum of the thicknesses of the nonmagnetic insertion layers is at least four Angstroms. For example, if two nonmagnetic insertion layers are used in the graded PEL, then each layer may be greater than or equal to two Angstroms thick but less than three Angstroms thick.

The nonmagnetic insertion layers in the graded PEL 130 may also improve the perpendicular magnetic anisotropy of the graded PEL layer 130. The use of the nonmagnetic insertion layers in the graded PEL may result in magnetically "dead" layers in the portions of the magnetic layers of the graded PEL that adjoin the nonmagnetic insertion layers. The saturation magnetization, $M_s$, may thus be reduced. A lower in-plane magnetic anisotropy ($4\pi M_s$) has to be overcome by the perpendicular magnetic anisotropy for the graded PEL 130 to have a high PMA and, therefore, an out-of-plane magnetic moment. The net perpendicular magnetic anisotropy of the graded PEL 130 may thus be increased allowing the graded PEL 130 to have a higher PMA.

The magnetic junction 100 may have improved performance. Because of the presence of the graded PEL 130, the magnetic junction 100 may have higher spin polarization and, therefore, a lower switching current. The crystal structures of the high PMA layer 150 and the nonmagnetic spacer layer 120, such as a crystalline MgO, may also be decoupled because of the presence of nonmagnetic insertion layers in the graded PEL layer 130. Thus, the high PMA layer 150 and the nonmagnetic spacer layer 120 may each have the desired crystalline orientation. As a result, a high TMR for the magnetic junction may be achieved. Note, however, that the thickness of each nonmagnetic insertion layer is smaller than a single layer that allows for a crystallographic transition between the high PMA layer 150 and the nonmagnetic spacer layer 120. Use of the nonmagnetic insertion layers, particularly if they are Ta insertion layers, may also improve the perpendicular anisotropy of the graded PEL 130. Such nonmagnetic insertion layers within the graded PEL 130 reduce the $M_s t$. As discussed above, the reduced $M_s t$ may allow for a higher perpendicular anisotropy in the graded PEL 130. Further, the graded PEL 130 includes nonmagnetic insertion layers that together may prevent diffusion of material(s) in the high PMA layer 150 from reaching the nonmagnetic spacer layer 120. Consequently, materials such as Ru may be used in the high PMA layer 150. Further, the optional coupling layer 140 may also include materials such as Ru. Use of the Ru may improve coupling within the high PMA layer 150 and between the high PMA layer 150 and the graded PEL 130. For example, the magnetic coupling between the high PMA layer 150 and the graded PEL 130 may be improved over a magnetic junction that uses Ta as the optional coupling layer. As a result, the stability of the graded PEL 130 and the high PMA layer 150 may be improved. Further, materials such as Pd may be used in the high PMA layer 150. Thus, the magnetic properties of the high PMA layer 150 may be improved. The thickness of each nonmagnetic insertion layer is smaller than a single layer that blocks diffusion. As a result, the magnetic layers within the graded PEL 130 may be better magnetically coupled to each other. Further, because the magnetic layers are separated by the nonmagnetic insertion layers, different materials may be used for different magnetic layers within the graded PEL 130. For example, a material having a higher RKKY coupling but lower spin polarization may be used near the high PMA layer 150 to enhance the magnetic coupling between the layers 130 and 150. Thus, performance of the magnetic junction 100 and the memory using the magnetic junction 100 may be improved.

Figure 3:
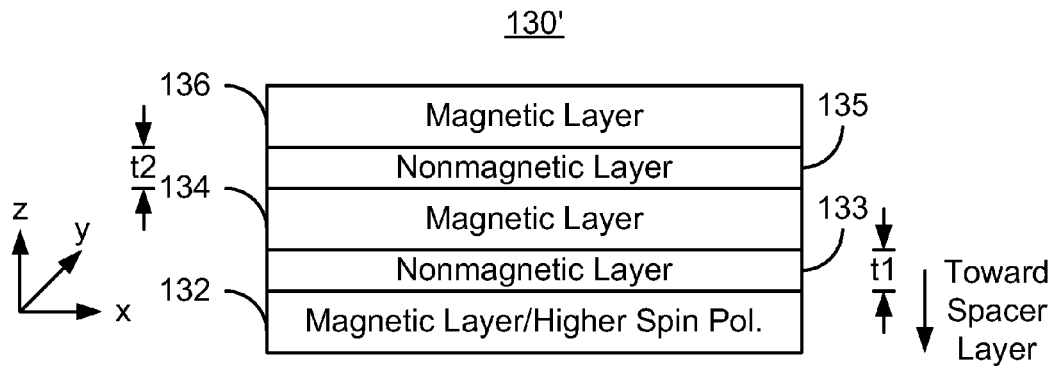
FIG. 3 depicts an exemplary embodiment of a graded PEL including nonmagnetic insertion layers.

FIG. 3 depicts an exemplary embodiment of a graded PEL 130' including nonmagnetic insertion layers usable in the reference stack a magnetic device such as the reference stack 160 in the magnetic junction 100. For clarity, FIG. 3 is not to scale. The graded PEL 130' is analogous to and may be used in place of the graded PEL 130 of FIG. 2. Referring to FIGS. 2-3, the graded PEL 130' may be magnetically coupled to the high PMA layer 150. In some embodiments, this coupling may be through the optional magnetic coupling layer 140. The graded PEL 130' includes magnetic layers 132, 134 and 136 interleaved with nonmagnetic insertion layers 133 and 135. Although three magnetic layers 132, 134 and 136 and two nonmagnetic insertion layers 133 and 135 are shown, another number of magnetic and/or nonmagnetic insertion layers may be used. Further, although magnetic layers 132 and 136 are depicted at both interfaces of the PEL (i.e. adjoining the nonmagnetic spacer layer 120 and the high PMA layer 150 or optional magnetic coupling layer 140), in other embodiments, a nonmagnetic layer may reside along the interface closest to the high PMA layer 150.

The magnetic layers 132, 134 and 136 are configured such that at least part of the graded PEL 130' has a higher spin polarization than the high PMA layer 150. The magnetic layer 132 has a higher spin polarization than the high PMA layer 150 and is the closest layer of the graded PEL 130' to the nonmagnetic spacer layer 120. For example, CoFeB having not more than forty atomic percent B may be used for the magnetic layer 132. In some embodiments, the CoFeB layer 132 may have at least ten and not more than twenty atomic percent B. The remaining magnetic layers 134 and 136 may or may not have this higher spin polarization. Thus, remaining the magnetic layers 134 and 136 in the graded PEL 130' may be made of the same or another material. These layers 134 and 136 may be separately tailored for other purposes. In some embodiments, the layer 134 is a CoFeB layer analogous to the layer 132. The magnetic layer 136 may be another material that has a stronger magnetic coupling with the high PMA layer 150 than the layers 132 and 134. For example, in some embodiments, the magnetic layer 136 include Co. Further, the magnetic layers 132, 134 and 136 are configured to have their magnetic moments perpendicular to plane (i.e. in the positive or negative z-direction). Thus, the perpendicular anisotropy energy may exceed the out-of-plane demagnetization energy. Finally, although the magnetic layers 132, 134 and 136 are depicted as having the same thickness, in some embodiments, the thicknesses of the layers 132, 134 and/or 136 may differ.

Two nonmagnetic insertion layers 133 and 135 are shown. In some embodiments, each of the nonmagnetic insertion layers 133 and 135 include Ta. In some such embodiments, each of the nonmagnetic insertion layers 133 and 135 consists of Ta. The nonmagnetic insertion layers 133 and 135 may thus decouple the crystal orientations of the nonmagnetic spacer layer and the high PMA layer. TMR of a magnetic junction using the graded PEL 130' may be enhanced. In addition, the nonmagnetic insertion layers 133 and 135 may enhance the $M_s t$ and thus the PMA of the graded PEL 130'. The nonmagnetic insertion layers 133 and 135 may also block diffusion of materials such as Pd and/or Ru through the graded PEL 130'. Each of the nonmagnetic insertion layers 133 and 135 has a thickness that is smaller than that which would be required for a single nonmagnetic insertion layer to block diffusion through the graded PEL 130'. Thus, the thickness of each of the nonmagnetic insertion layers 133 and 135 is insufficient for the diffusion blocking between the high PMA layer 150 and the nonmagnetic spacer layer 120. Similarly, the thickness of each of the nonmagnetic insertion layers 133 and 135 is insufficient for causing a crystallographic transition between the high PMA layer 150 and the nonmagnetic spacer layer 120. In some embodiments, the thickness of each nonmagnetic insertion layer 133 and 135 is at least one Angstroms but less than three Angstroms. The sum of the thicknesses (e.g. t1+t2) for the nonmagnetic insertion layers 133 and 135 is sufficient to provide diffusion blocking between the high PMA layer 150 and the nonmagnetic spacer layer 120 and to allow for the crystallographic orientations of the high PMA layer 150 to differ from that of the nonmagnetic spacer layer. In some embodiments, the sum of the thicknesses of the nonmagnetic insertion layers is at least four Angstroms. Further, in some embodiments, the total thickness of the graded PEL 130' is not more than one nanometer.

Use of the PEL 130' may allow magnetic junctions such as the magnetic junction 100 to have improved performance. Because of the presence of the graded PEL 130' and, more specifically, the higher spin polarization magnetic layer 132, the magnetic junction may require a lower switching current. The nonmagnetic insertion layers 133 and 135 may decouple the crystal orientations of the nonmagnetic and high PMA layers. This allows for improved TMR of the magnetic junction employing the graded PEL 130'. Use of the nonmagnetic insertion layers 133 and 135, particularly if they consist of Ta, may also improve the perpendicular anisotropy of the magnetic layers 132, 134 and 136. Further, the nonmagnetic insertion layers 133 and 135 together may prevent diffusion of material(s) in the high PMA layer and optional coupling layer from reaching the nonmagnetic spacer layer. Consequently, materials such as Pd and/or Ru may be used in the high PMA layer and/or optional magnetic coupling layer without adversely affecting a crystalline MgO tunneling barrier layer that may be used for the nonmagnetic spacer layer. Magnetic coupling within the high PMA layer and between the high PMA layer and the graded PEL 130' may be enhanced. Because the nonmagnetic insertion layers 133 and 135 are thinner than a single nonmagnetic barrier layer (not shown), the magnetic coupling between the magnetic layers 132, 134 and 136 may be improved. Further, because the magnetic layers 132, 134 and 136 are separated by the nonmagnetic insertion layers 133 and 135, different materials may be used for different magnetic layers 132, 134 and 136. Thus, performance of a magnetic junction including the PEL 130' and the memory using the magnetic junction including the PEL 130' may be improved.

Figure 4:
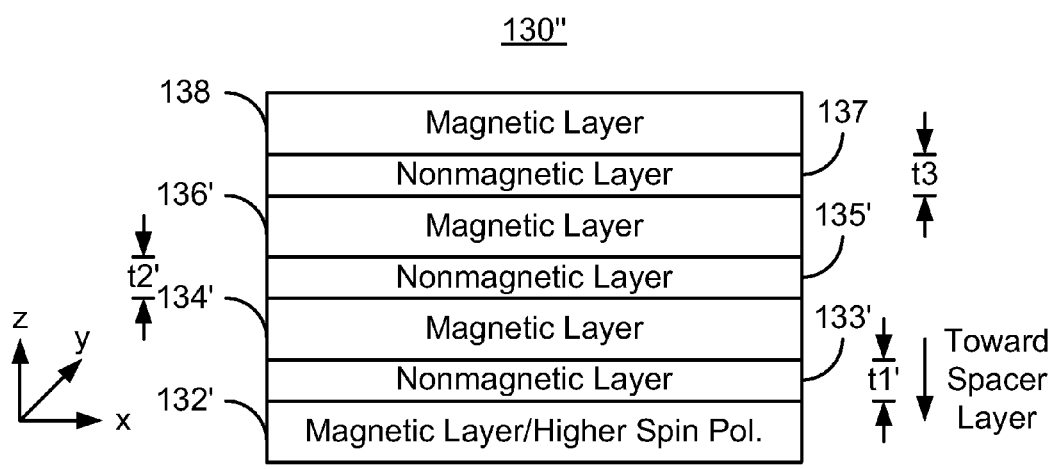
FIG. 4 depicts another exemplary embodiment of a graded PEL including nonmagnetic insertion layers.

FIG. 4 depicts an exemplary embodiment of a graded PEL 130" including nonmagnetic insertion layers usable in a magnetic device such as the magnetic junction 100. For clarity, FIG. 4 is not to scale. The graded PEL 130" is analogous to may be used for the graded PEL 130' and/or 130 of FIGS. 2 and 3. Consequently, analogous components are labeled similarly. Referring to FIGS. 2-4, the graded PEL 130" may be magnetically coupled to the high PMA layer 150. In some embodiments, this coupling may be through the optional magnetic coupling layer 140. The graded PEL 130" includes magnetic layers 132', 134' and 136' interleaved with nonmagnetic insertion layers 133' and 135'. The layers 132', 133', 134', 135' and 136' are analogous to the layers 132, 133, 134, 135, 136, respectively. In addition, the graded PEL 130" includes nonmagnetic layer 137 and magnetic layer 138. The magnetic layer 138 may be considered analogous to the layer 136 in that it may be desirable to use a higher RKKY coupling material for the magnetic layer 138. Further, it may be desirable to use a material such as CoFeB for the layer 136' because the layer 136' is no longer at the edge of the graded PEL 130". Although four magnetic layers 132', 134', 136' and 138 and three nonmagnetic insertion layers 133', 135' and 137 are shown, another number of magnetic and/or nonmagnetic insertion layers may be used. Further, although magnetic layers 132' and 138 are depicted at both interfaces of the PEL (i.e. adjoining the nonmagnetic spacer layer and the high PMA layer/optional magnetic coupling layer), in other embodiments, a nonmagnetic layer may reside along the interface closest to the high PMA layer.

The magnetic layers 132', 134', 136' and 138 are configured in an analogous manner to the layers 132, 134 and 136. Thus, the layer 132' may have a higher spin polarization than the high PMA layer and is the closest layer of the graded PEL 130" to the nonmagnetic spacer layer. For example, CoFeB having not more than forty atomic percent B may be used for the magnetic layer 132'. In some embodiments, the CoFeB' layer 132' may have at least ten and not more than twenty atomic percent B. The remaining magnetic layers 134', 136' and 136 may or may not have this higher spin polarization. Thus, remaining the magnetic layers 134', 136' and 138 may be made of the same or another material. These layers 134', 136' and 138 may be separately tailored for other purposes. In some embodiments, the layers 134' and 136' are CoFeB layers analogous to the layer 132'. The magnetic layer 138 may be another material that has a stronger magnetic coupling with the high PMA layer than the layers 132', 134' and 136. For example, in some embodiments, the magnetic layer 136 includes Co. Further, the magnetic layers 132', 134', 136' and 138 are configured to have their magnetic moments perpendicular to plane (i.e. in the positive or negative z-direction). Thus, the perpendicular anisotropy energy may exceed the out-of-plane demagnetization energy. Finally, although the magnetic layers 132', 134', 136' and 138 are depicted as having the same thickness, in some embodiments, the thicknesses of the layers 132', 134', 136' and/or 138 may differ.

Three nonmagnetic insertion layers 133', 135' and 137 are shown. In some embodiments, each of the nonmagnetic insertion layers 133', 135' and 137 include Ta. In some such embodiments, each of the nonmagnetic insertion layers 133', 135' and 137 consists of Ta. The nonmagnetic insertion layers 133', 135' and 137 may be used to decouple the crystalline orientations of the high PMA and nonmagnetic spacer layers, thereby improving TMR. In addition, the nonmagnetic spacer layers 133', 135' and 137 may enhance the PMA of the graded PEL 130". The nonmagnetic insertion layers 133', 135' and 137 are, therefore, to be used to block diffusion of materials such as Pd and/or Ru through the graded PEL 130". Each of the nonmagnetic insertion layers 133', 135' and 137 has a thickness that is smaller than that which would be required for a single nonmagnetic insertion layer to block diffusion through the graded PEL 130". Thus, the thickness of each of the nonmagnetic insertion layers 133', 135' and 137 is insufficient for the diffusion blocking between the high PMA layer and the nonmagnetic spacer layer. Similarly, in some embodiments, the thickness of each of the nonmagnetic insertion layers 133', 135' and 137 is insufficient for the crystallographic orientation of the high PMA layer to be decoupled from that of the nonmagnetic spacer layer. In some embodiments, the thickness of each nonmagnetic insertion layer 133', 135' and 137 is at least one Angstrom but less than three Angstroms. In some such embodiments, the thickness of each nonmagnetic insertion layer 133', 135' and 137 is at least two Angstroms. The sum of the thicknesses (e.g. t1'+t2'+t3) for the nonmagnetic insertion layers 133', 135' and 137 is sufficient to provide diffusion blocking between the high PMA layer and the nonmagnetic spacer layer. Similarly, the sum of the thicknesses of the nonmagnetic insertion layers 133', 135' and 137 is sufficient to disrupt the imposition of crystal order from the high PMA layer to the nonmagnetic spacer layer. In some embodiments, the sum of the thicknesses of the nonmagnetic insertion layers is at least four Angstroms.

The PEL 130" share the benefits of the PEL 130 and/or 130'. Use of the PEL 130' may allow a magnetic junctions such as the magnetic junction 100 to have improved performance such as a lower switching current, enhanced perpendicular magnetic anisotropy, improved TMR, enhanced magnetic coupling and, therefore, improved stability. These benefits may be achieved without adversely affecting the nonmagnetic spacer layer/tunneling barrier layer. Thus, performance of a magnetic junction including the PEL 130' and the memory using the magnetic junction including the PEL 130' may be improved.

Figure 5:
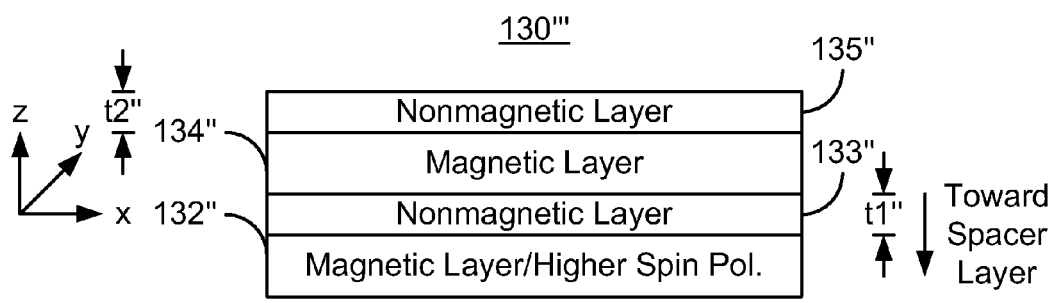
FIG. 5 depicts another exemplary embodiment of a graded PEL including nonmagnetic insertion layers.

FIG. 5 depicts an exemplary embodiment of a graded PEL 130''' including nonmagnetic insertion layers usable in a magnetic device such as the magnetic junction 100. For clarity, FIG. 5 is not to scale. The graded PEL 130''' is analogous to may be used for the graded PEL 130", 130' and/or 130 of FIGS. 2-4. Consequently, analogous components are labeled similarly. Referring to FIGS. 2-5, the graded PEL 130" may be magnetically coupled to the high PMA layer 150. In some embodiments, this coupling may be through the optional magnetic coupling layer. The graded PEL 130''' includes magnetic layers 132" and 134" interleaved with nonmagnetic insertion layers 133" and 135". The layers 132", 133", 134" and 135" are analogous to the layers 132/132', 133/133', 134/134' and 135/135', respectively. Although two magnetic layers 132" and 134" and two nonmagnetic insertion layers 133" and 135" are shown, another number of magnetic and/or nonmagnetic insertion layers may be used. In the embodiment shown, a nonmagnetic layer 135" is at the interface of the PEL 130''' closest to the high PMA layer. However, in other embodiments, a magnetic layer may reside along the interface closest to the high PMA layer.

The magnetic layers 132" and 134" are configured in an analogous manner to the layers 132/132', 134/134' and 136/136'. Thus, the layer 132" may have a higher spin polarization than the high PMA layer and is the closest layer of the graded PEL 130''' to the nonmagnetic spacer layer. For example, CoFeB having not more than forty atomic percent B may be used for the magnetic layer 132". In some embodiments, the CoFeB' layer 132" may have at least ten and not more than twenty atomic percent B. The remaining magnetic layer 134' may or may not have this higher spin polarization. Thus, remaining the magnetic layer 134" may be made of the same or another material. This layer 134" may be separately tailored for other purposes. In some embodiments, the layer 134" is a CoFeB layer analogous to the layer 132". Further, the magnetic layers 132" and 134" are configured to have their magnetic moments perpendicular to plane (i.e. in the positive or negative z-direction). Thus, the perpendicular anisotropy energy may exceed the out-of-plane demagnetization energy. Finally, although the magnetic layers 132" and 134" are depicted as having the same thickness, in some embodiments, the thicknesses of the layers 132" and 134" may differ.

Two nonmagnetic insertion layers 133" and 135" are shown. In some embodiments, each of the nonmagnetic insertion layers 133" and 135" include Ta. In some such embodiments, each of the nonmagnetic insertion layers 133" and 135" consists of Ta. The nonmagnetic insertion layers 133" and 135" may decouple the crystalline orientations of the high PMA and nonmagnetic spacer layers, thereby improving TMR. In addition, the nonmagnetic spacer layers 133" and 135" may enhance the PMA of the graded PEL 130". The nonmagnetic insertion layers 133" and 135" may also block diffusion of materials such as Pd and/or Ru through the graded PEL 130". Each of the nonmagnetic insertion layers 133" and 135" has a thickness that is smaller than that which would be required for a single nonmagnetic insertion layer to block diffusion through the graded PEL 130'''. Thus, the thickness of each of the nonmagnetic insertion layers 133" and 135" is insufficient for the diffusion blocking between the high PMA layer and the nonmagnetic spacer layer and insufficient to disrupt the crystallographic coupling between the high PMA layer and the nonmagnetic spacer layer. In some embodiments, the thickness of each nonmagnetic insertion layer 133" and 135" is at least two Angstroms but less than three Angstroms. The sum of the thicknesses (e.g. t1"+t2") for the nonmagnetic insertion layers 133" and 135" is sufficient to provide diffusion blocking between the high PMA layer and the nonmagnetic spacer layer. In some embodiments, the sum of the thicknesses of the nonmagnetic insertion layers is at least four Angstroms. Although the nonmagnetic layer 135" may be at the interface between the PEL 130''' and the high PMA layer 150", the PEL 130''' is still expected to have improved magnetic coupling with the high PMA layer. The thickness, t2" of the nonmagnetic insertion layer 135" is less than that of a diffusion barrier layer. Thus, despite the fact that a Ru (or other higher RKKY interaction material) is not used, the magnetic coupling with the high PMA layer may be enhanced.

The PEL 130''' share the benefits of the PEL 130, 130' and/or 130". Use of the PEL 130''' may allow a magnetic junctions such as the magnetic junction 100 to have improved performance such as a lower switching current, improved TMR, enhanced perpendicular magnetic anisotropy, enhanced magnetic coupling and, therefore, improved stability. These benefits may be achieved without adversely affecting the nonmagnetic spacer layer/tunneling barrier layer. Thus, performance of a magnetic junction including the PEL 130" and the memory using the magnetic junction including the PEL 130" may be improved.

Figure 6:
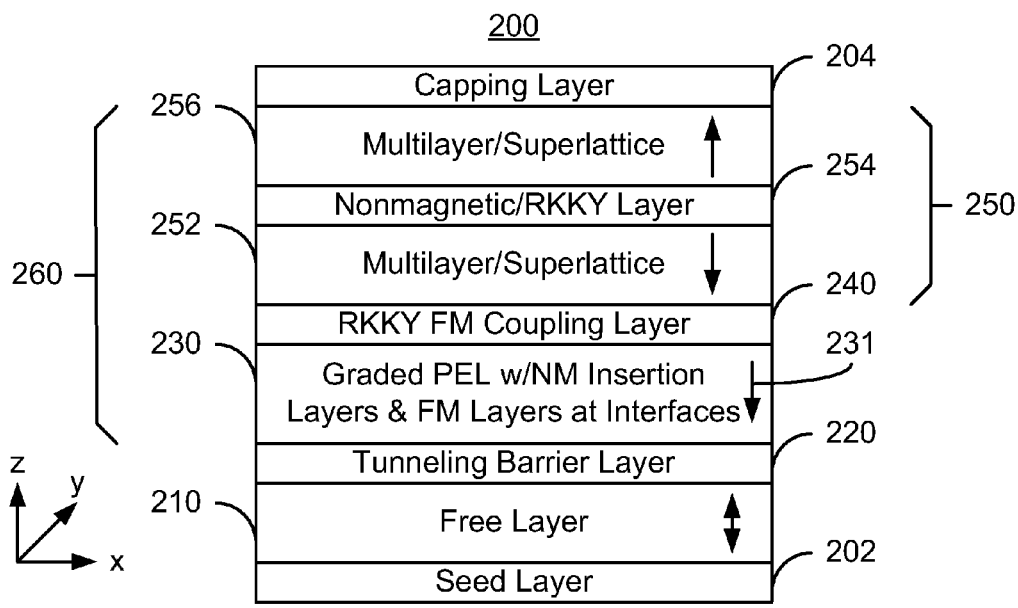
FIG. 6 depicts another exemplary embodiment of a magnetic junction including a graded PEL including nonmagnetic insertion layers and switchable via spin transfer.

FIG. 6 depicts another exemplary embodiment of a magnetic junction 200 including a reference stack having a graded PEL including nonmagnetic insertion layers and that is switchable via spin transfer. For clarity, FIG. 6 is not to scale. The magnetic junction 200 is analogous to the magnetic junction 100. Consequently, analogous components are labeled similarly. The magnetic junction 200 includes a seed layer 202, a free layer 210, a nonmagnetic spacer layer that may be a tunneling barrier layer 220 in this embodiment, a reference stack 260 and optional capping layer 204 that are analogous to the seed layer 102, the free layer 110, the nonmagnetic spacer layer 120, and the reference stack 160, respectively. The reference stack 260 includes a graded PEL 230, a magnetic coupling layer 240, and a high PMA layer 250 that are analogous to the PEL 130/130'/130"/130''', the optional magnetic coupling layer 140, and the high PMA layer 150, respectively. Consequently, analogous components have a similar structure and function to the corresponding components.

In the magnetic junction 200, the high PMA layer 250 is a SAF. In particular, the high PMA layer 250 includes magnetic layers 252 and 256 separated by nonmagnetic layer 254. The nonmagnetic layer 254 allows an RKKY interaction between the magnetic layers 252 and 254. In the embodiment shown, the layers 252 and 254 are antiferromagnetically coupled. In addition, the layers 252 and 254 are a multilayer or superlattice having a perpendicular anisotropy that exceeds the out-of-plane demagnetization energy. For example, a Co/Pd and/or CoPt multilayer and/or superlattice may be used. In addition, the magnetic layers 252 and 256 may include other materials such as a Pt layer, and/or a Co layer. In some embodiments, the Co layers are at least one and not more than two Angstroms thick. Similarly, the Pd and Pt layers may be at least one and not more than two Angstroms thick.

The graded PEL 230 thus includes magnetic layers interleaved with nonmagnetic insertion layers. For simplicity, the magnetic and nonmagnetic insertion layers are not shown in FIG. 6. However, as discussed above, the graded PEL 230 is analogous to the graded PEL 130, 130' and/or 130". The graded PEL 230 is explicitly coupled to the high PMA layer 250 through the coupling layer 240. The coupling layer 240 is analogous to the layer 140. In some embodiments, the coupling layer allows for an RKKY interaction between the high PMA layer 250 (the layer 252 of the high PMA layer 250) and the graded PEL 230. In the embodiment shown, the coupling layer 240 ferromagnetically couples the PEL 230 with the layer 252. Thus, the graded PEL 230 is shown as having magnetic moment 231 in the negative z-direction. In another embodiment, the magnetic moment 231 may be in the opposite direction to that shown. The graded PEL 230 is also desired to have magnetic layers at both interfaces. As a result, the RKKY coupling between the PEL 230 and the layer 252 may be improved. In addition, a magnetic layer of the PEL 230 having a higher spin polarization than the multilayer 252 and/or 256 shares an interface with the tunneling barrier layer 220. Further, the magnetic layers of the graded PEL 230 may be separately tailored. For example, the magnetic layer closest to the coupling layer 240 may be configured to enhance the RKKY coupling with the magnetic layer 252.

The magnetic junction 200 shares the benefits of the magnetic junction 100 and the PEL 130, 130', 130" and/or 130'''. The magnetic junction 200 may have improved performance such as a lower switching current, higher TMR, enhanced perpendicular magnetic anisotropy, enhanced magnetic coupling and, therefore, improved stability. These benefits may be achieved without adversely affecting the tunneling barrier layer 220. Thus, performance of a magnetic junction 200 and the memory using the magnetic junction 200 may be improved.

Figure 7:
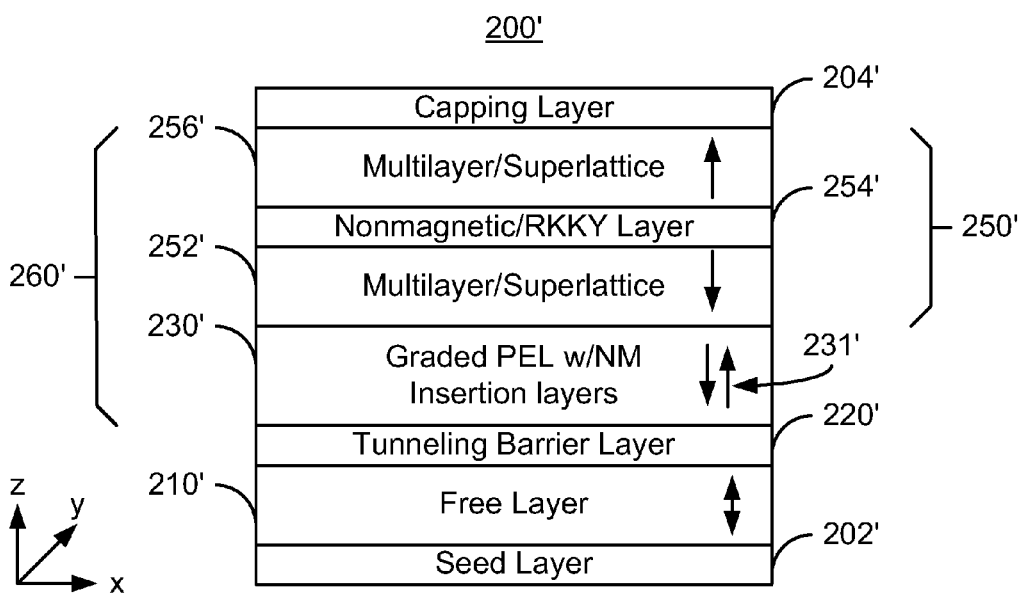
FIG. 7 depicts another exemplary embodiment of a magnetic junction including a graded PEL including nonmagnetic insertion layers and switchable via spin transfer.

FIG. 7 depicts another exemplary embodiment of a magnetic junction 200' including a reference stack having a graded PEL including nonmagnetic insertion layers and that is switchable via spin transfer. For clarity, FIG. 7 is not to scale. The magnetic junction 200' is analogous to the magnetic junctions 100 and/or 200. Consequently, analogous components are labeled similarly. The magnetic junction 200' includes a seed layer 202', a free layer 210', a nonmagnetic spacer layer that may be a tunneling barrier layer 220' in this embodiment, a reference stack 260' and optional capping layer 204' that are analogous to the seed layer 102/202, the free layer 110/210, the nonmagnetic spacer layer 120/220, the reference stack 160/260 and the capping layer 104/204, respectively. The reference stack 260' includes a graded PEL 230', a magnetic coupling layer 240' and a high PMA layer 250' that are analogous to the PEL 130/130'/130"/130'"/220 and the high PMA layer 150/250, respectively. Consequently, analogous components have a similar structure and function to the corresponding components.

In the magnetic junction 200', the high PMA layer 250' is a SAF that is analogous to the SAF 250. Thus, the high PMA layer 250' includes magnetic layers 252' and 256' separated by nonmagnetic layer 254' that are analogous to the layers 252, 256, and 254, respectively. However, in other embodiments, the high PMA layer 250' may not be a SAF. Instead, the high PMA layer 250' may be a single layer. However, a multilayer, superlattice, simple ferromagnetic layer(s) and/or nonmagnetic layers may be included in the high PMA layer 250'.

The graded PEL 230' includes magnetic layers interleaved with nonmagnetic insertion layers. For simplicity, the magnetic and nonmagnetic insertion layers are not shown in FIG. 7. However, as discussed above, the graded PEL 230' is analogous to the graded PEL 130, 130', 130" and/or 130'". The graded PEL 230' is coupled to the high PMA layer 250'. The graded PEL 230' may have a magnetic layer at the interface with the multilayer 252' or may have a nonmagnetic insertion layer at the interface with the multilayer 252'. If the graded PEL 230' has a magnetic layer at the interface with the multilayer 252', the graded PEL 230' is directly exchange coupled (i.e. ferromagnetically coupled) with the multilayer 252'. If the nonmagnetic insertion layer at the interface is sufficiently thin, the graded PEL 230' is ferromagnetically coupled with the multilayer 252'. However, if the nonmagnetic insertion layer at the interface is sufficiently thick, then the graded PEL 230' may be antiferromagnetically coupled with the layer 252'. Thus, the magnetic moment 231' of the graded PEL 230' may be either parallel or antiparallel to the moment of the magnetic layer 252'. As such, two arrows in opposite direction are shown for the magnetic moment 231' of the graded PEL 230'. A magnetic layer of the PEL 230' having a higher spin polarization than the multilayer 252' and 256' shares an interface with the tunneling barrier layer 220'. Further, the magnetic layers of the graded PEL 230' may be separately tailored.

The magnetic junction 200' shares the benefits of the magnetic junction 100 and/or 200 and the PEL 130, 130', 130" and/or 130'". The magnetic junction 200' may have improved performance such as a lower switching current, enhanced TMR, enhanced perpendicular magnetic anisotropy, enhanced magnetic coupling and, therefore, improved stability. These benefits may be achieved without adversely affecting the tunneling barrier layer 220'. Thus, performance of a magnetic junction 200' and the memory using the magnetic junction 200' may be improved.

Figure 8:
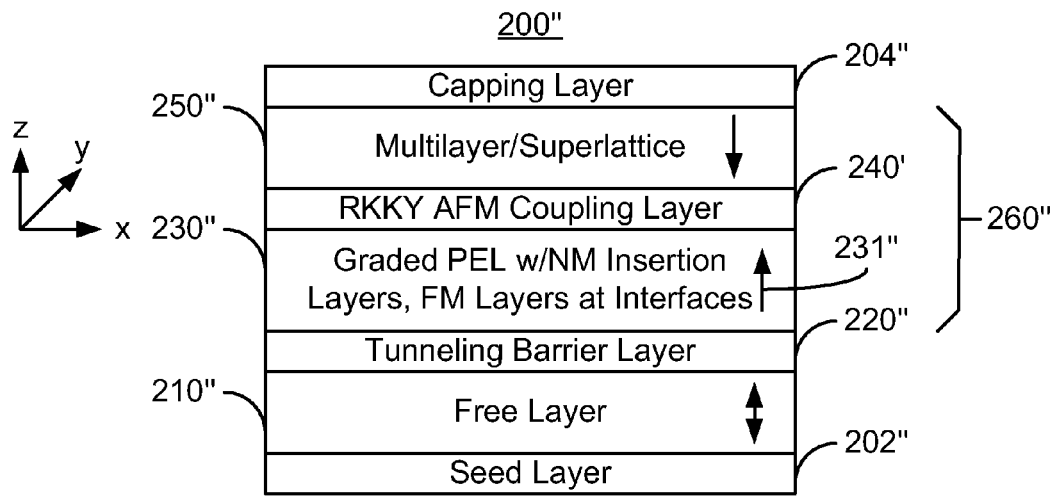
FIG. 8 depicts another exemplary embodiment of a magnetic junction including a graded PEL including nonmagnetic insertion layers and switchable via spin transfer.

FIG. 8 depicts another exemplary embodiment of a magnetic junction 200" including a reference stack having a graded PEL including nonmagnetic insertion layers and that is switchable via spin transfer. For clarity, FIG. 8 is not to scale. The magnetic junction 200" is analogous to the magnetic junction 100, 200 and/or 200'. Consequently, analogous components are labeled similarly. The magnetic junction 200" includes a seed layer 202", a free layer 210", a nonmagnetic spacer layer that may be a tunneling barrier layer 220" in this embodiment, a reference stack 260" and optional capping layer 204" that are analogous to the seed layer 102/202/202', the free layer 110/210/210', the nonmagnetic spacer layer 120/220/220', the reference stack 160/260/260' and the capping layer 104/204/204', respectively. The reference stack 260" includes a graded PEL 230", a magnetic coupling layer 240" and a high PMA layer 250" that are analogous to the PEL 130/130'/130"/130'"/230/230', the optional magnetic coupling layer 140/240 and the high PMA layer 150/250/250', respectively. Consequently, analogous components have a similar structure and function to the corresponding components.

In the magnetic junction 200", the high PMA layer 250" is a not a SAF. However, the high PMA layer 250" may still be a multilayer or superlattice having a perpendicular anisotropy that exceeds the out-of-plane demagnetization energy. For example, a Co/Pd and/or CoPt multilayer and/or superlattice may be used. In addition, the high PMA layer 250" may include other materials such as a Pt layer, and/or a Co layer.

In the embodiment shown, the graded PEL 230" includes magnetic layers interleaved with nonmagnetic insertion layers. For simplicity, the magnetic and nonmagnetic insertion layers are not shown in FIG. 8. However, as discussed above, the graded PEL 230" is analogous to the graded PEL 230, 230', 130, 130' and/or 130". The graded PEL 230" is explicitly coupled to the high PMA layer 250" through the coupling layer 240". The coupling layer 240" is analogous to the layer 140 and/or 240. In some embodiments, the coupling layer allows for an RKKY interaction between the high PMA layer 250" and the graded PEL 230". In the embodiment shown, the coupling layer 240 antiferromagnetically couples the PEL 230" with the high PMA layer 250". Thus, the graded PEL 230" is shown as having magnetic moment 231 in the positive z-direction. As a result, the PEL 230" and the high PMA layer 250" may be considered to form a SAF together. The graded PEL 230" is also desired to have magnetic layers at both interfaces. As a result, the RKKY coupling between the PEL 230" and the high PMA layer 250" may be improved. In addition, a magnetic layer of the PEL 230" having a higher spin polarization than the high PMA layer 250" shares an interface with the tunneling barrier layer 220". Further, the magnetic layers of the graded PEL 230" may be separately tailored. For example, the magnetic layer closest to the coupling layer 240" may be configured to enhance the RKKY coupling with the high PMA layer 250".

The magnetic junction 200" shares the benefits of the magnetic junction 100, 200, and/or 200' and the PEL 130, 130', 130" and/or 130'". The magnetic junction 200" may have improved performance such as a lower switching current, improved TMR, enhanced perpendicular magnetic anisotropy, enhanced magnetic coupling and, therefore, improved stability. Further, the PEL 230" and the high PMA layer 250" may be antiferromagnetically coupled to reduce the external field on the free layer 210". These benefits may be achieved without adversely affecting the tunneling barrier layer 220".

Thus, performance of a magnetic junction 200" and the memory using the magnetic junction 200" may be improved.

Figure 9:
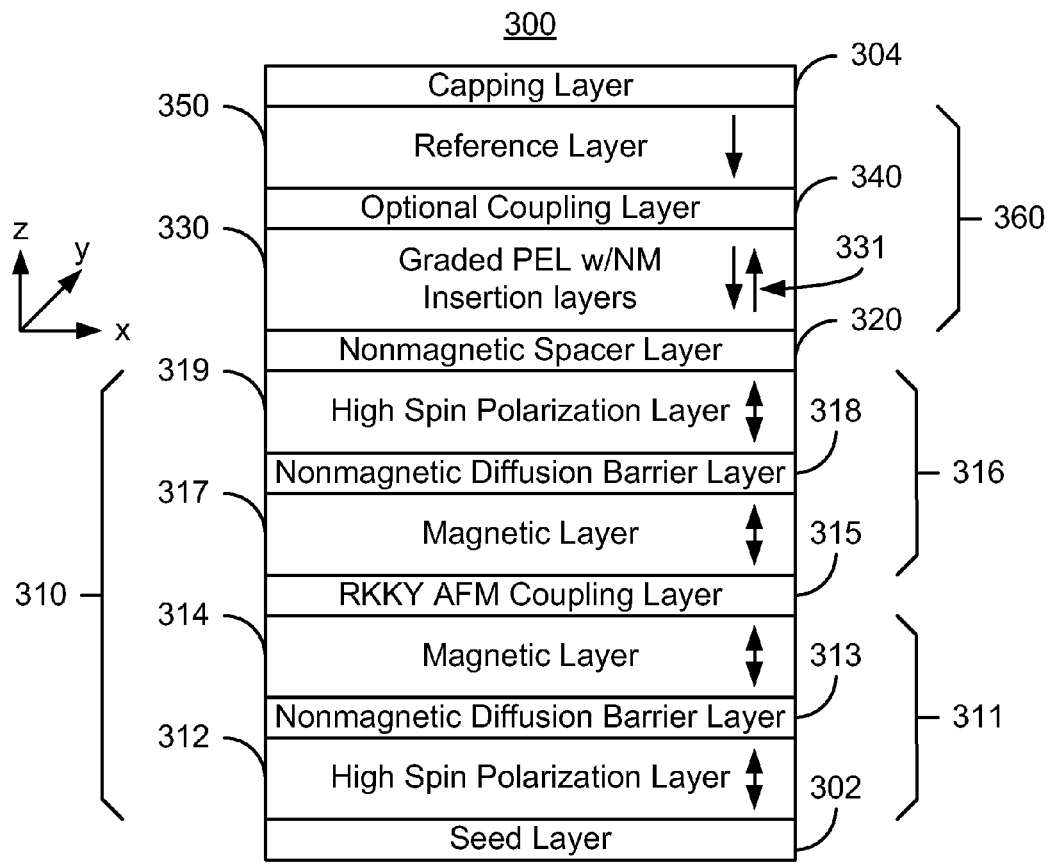
FIG. 9 depicts another exemplary embodiment of a magnetic junction including a graded PEL including nonmagnetic insertion layers and switchable via spin transfer.
Figure 10:
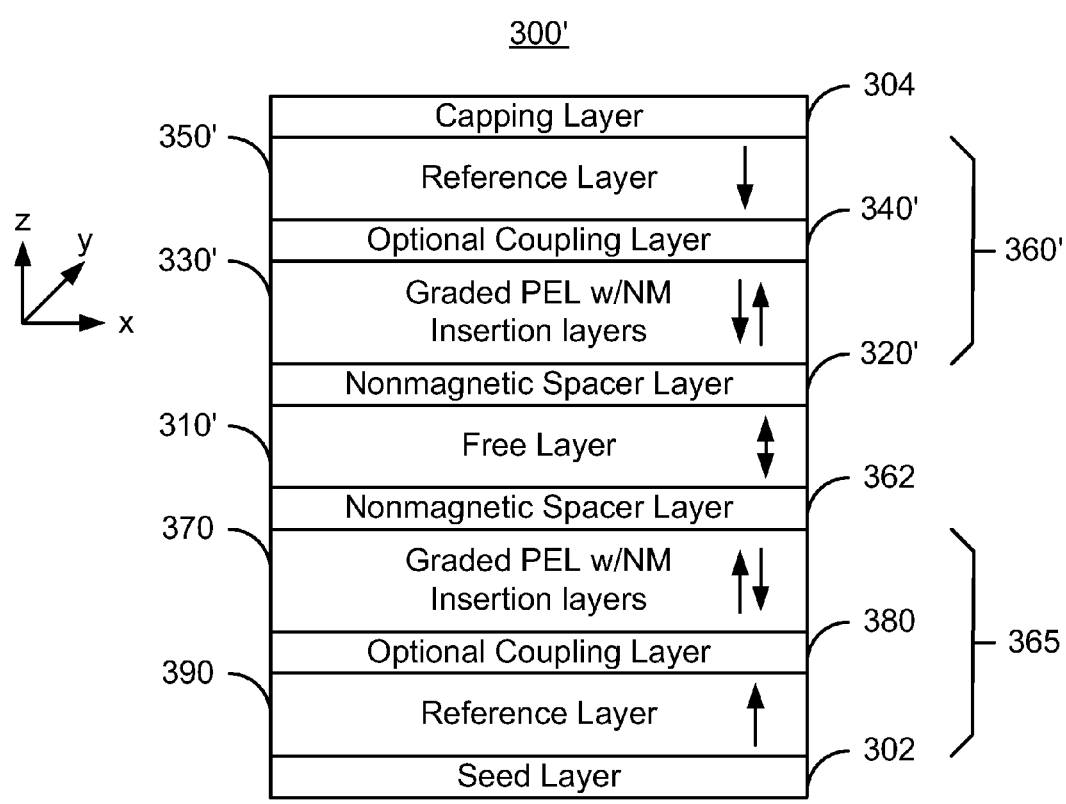
FIG. 10 depicts another exemplary embodiment of a magnetic junction including a graded PEL including nonmagnetic insertion layers and switchable via spin transfer.

FIG. 9 depicts another exemplary embodiment of a magnetic junction 300 including a reference stack having a graded PEL including nonmagnetic insertion layers and that is switchable via spin transfer. For clarity, FIG. 10 is not to scale. The magnetic junction 300 is analogous to the magnetic junction 100, 200, 200' and/or 200". Consequently, analogous components are labeled similarly. The magnetic junction 300 includes a seed layer 302, a free layer 310, a nonmagnetic spacer layer that may be a tunneling barrier layer 320 in this embodiment, a reference stack 360 and optional capping layer 304 that are analogous to the seed layer 102/202/202'/202", the free layer 110/210/210'/210", the nonmagnetic spacer layer 120/220/220'/220", reference stack 160/260/260'/260" and the optional magnetic capping layer 104/204/204'/204". The reference stack 160/260/260'/260" includes a graded PEL 330, an optional magnetic coupling layer 340 and a high PMA 350 that are analogous to the PEL 130/130'/130"/130'''/230/230'/230", the optional magnetic coupling layer 140/240/240' and the high PMA layer 150/250/250'/250", respectively. Consequently, analogous components have a similar structure and function to the corresponding components.

The graded PEL 330 thus includes magnetic layers interleaved with nonmagnetic insertion layers. For simplicity, the magnetic and nonmagnetic insertion layers are not shown in FIG. 9. However, as discussed above, the graded PEL 330 is analogous to the graded PEL 130, 130', 130", 230, 230' and/or 230". The graded PEL 330 is explicitly coupled to the high PMA layer 350 through the coupling layer 340. The coupling layer 340 is analogous to the layer 340. In some embodiments, the coupling layer allows for an RKKY interaction between the high PMA layer 350 and the graded PEL 230. In the embodiment shown, the coupling layer 340 may ferromagnetically or antiferromagnetically couple the PEL 330 with the high PMA layer 350. The nature of the coupling may depend upon the thickness of the coupling layer 340 and the thickness of a nonmagnetic insertion layer (if any) residing at the interface of the graded PEL 330 with the optional coupling layer 340 or high PMA layer 350. Thus, the graded PEL 330 is shown as having magnetic moment 331 that may be in the positive or negative z-direction.

In the magnetic junction 300, the free layer 310 is a SAF. In particular, the free layer 310 includes magnetic layers 311 and 316 separated by nonmagnetic layer 315. The nonmagnetic layer 315 allows an RKKY interaction between the magnetic layers 311 and 316. The nonmagnetic layer 315 may, for example, be a Ru layer having a thickness that allows for the desired coupling between the magnetic layers 311 and 316.

Further, the magnetic layers 311 and 316 may be analogous to the PEL 130, 130', 130", 130''', 230, 230', and/or 230". For example, the magnetic layer 311 may include magnetic layers 312 and 314 separated by a nonmagnetic diffusion barrier layer 313. The magnetic layer 316 may include magnetic layers 317 and 319 separated by a nonmagnetic diffusion barrier layer 318. In addition, the layers 312, 314, 317 and/or 319 may be a multilayer or superlattice having a perpendicular anisotropy that exceeds the out-of-plane demagnetization energy. For example, a Co/Pd and/or CoPt multilayer and/or superlattice may be used. In addition, the magnetic layers 312, 314, 317 and/or 319 may include other materials such as a Pt layer, and/or a Co layer. At least the magnetic layer 319 closest to the nonmagnetic spacer layer/tunneling barrier layer 320 may be desired to have a high spin polarization. For example, CoFeB having not more than forty atomic percent B may be used for the layer 319. In some such embodiments, the magnetic layer 319 may include at least ten and not more than forty percent B in the CoFeB. Further, the layers 314 and 317 may be tailored to improve the RKKY coupling between the layers 311 and 316.

The magnetic junction 300 shares the benefits of the magnetic junction 100, 200, 200', 200" and the PEL 130, 130', 130" and/or 130'''. The magnetic junction 300 may have improved performance such as a lower switching current, improved TMR, enhanced perpendicular magnetic anisotropy, enhanced magnetic coupling and, therefore, improved stability. These benefits may be achieved without adversely affecting the tunneling barrier layer 320. In addition, the free layer 310 may be a SAF that employs Ru and/or Pd without adversely affecting any crystalline MgO used in the nonmagnetic spacer layer 320. This is because of the presence of the nonmagnetic diffusion barrier layers 313. In embodiments in which these layers 313 and 318 are thin as described with respect to the PELs 130, 130', 130", 130''', 230, 230' and/or 230", magnetic coupling between the layers 312 and 314 and the layers 317 and 319 may be enhanced. Thus, performance of a magnetic junction 300 and the memory using the magnetic junction 300 may be improved.

FIG. 10 depicts another exemplary embodiment of a magnetic junction 300' including a reference stack having a graded PEL including nonmagnetic insertion layers and that is switchable via spin transfer. For clarity, FIG. 10 is not to scale. The magnetic junction 300' is analogous to the magnetic junction 100, 200, 200', 200" and/or 300. Consequently, analogous components are labeled similarly. The magnetic junction 300' includes a seed layer 302', a free layer 310', a nonmagnetic spacer layer that may be a tunneling barrier layer 320' in this embodiment, a reference stack 360' and optional capping layer 304' that are analogous to the seed layer 102/202/202'/202"/302, the free layer 110/210/210'/210"/310, the nonmagnetic spacer layer 120/220/220'/220"/320 and the capping layer 104/204/204'/204"/304, respectively. The reference stack 360' includes a graded PEL 330', an optional magnetic coupling layer 340' and a high PMA layer 350' that are analogous to the PEL 130/130'/130"/130'''/230/230'/230"/330, the optional magnetic coupling layer 140/240/240'/340 and the high PMA layer 150/250/250'/250"/350, respectively. Consequently, analogous components have a similar structure and function to the corresponding components.

The magnetic junction also includes an additional nonmagnetic spacer layer 365, an optional additional graded PEL 370, an optional magnetic coupling layer 380 and an additional high PMA layer 390. The nonmagnetic spacer layer 365 is analogous to the nonmagnetic spacer layer 320'. The optional additional graded PEL 370 is analogous to the PEL 130, 130', 130", 130''', 230, 230', 230", 330 and/or 330'. The optional coupling layer 380 is analogous to the optional coupling layers 140, 240, 240', 340 and/or 340'. The high PMA layer 390 is analogous to the high PMA layers 150, 250, 250', 250", 250, 350 and/or 350'. Thus, the magnetic junction 300' is a dual magnetic junction. In embodiments in which layers 320' and 365 are both tunneling barriers, the magnetic junction 300' is a dual MTJ. In embodiments in which layers 320' and 365 are both conductive barriers, the magnetic junction 300' is dual spin valve. In other embodiments, however, the layers 320' and 365 need not share similar properties. For example, one of the layers 320' and 365 may be conductive while the other is a tunneling barrier layer.

The magnetic junction 300' shares the benefits of the magnetic junction 100, 200, 200', 200", 300 and the PEL 130, 130', 130" and/or 130'''. The magnetic junction 300' may have improved performance such as a lower switching current, enhanced perpendicular magnetic anisotropy, enhanced magnetic coupling and, therefore, improved stability. These benefits may be achieved without adversely affecting the tunneling barrier layers 320' and/or 365. Thus, performance of a magnetic junction 300' and the memory using the magnetic junction 300' may be improved.

Figure 11:
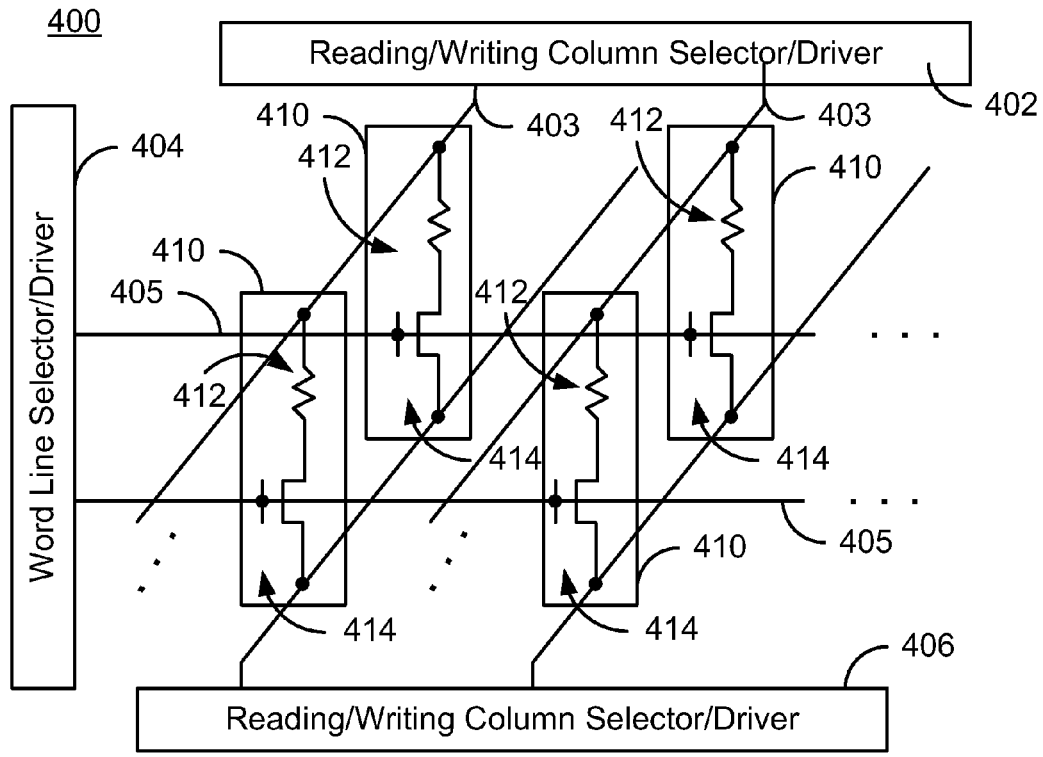
FIG. 11 depicts an exemplary embodiment of a memory utilizing magnetic junctions in the memory element(s) of the storage cell(s).

Further, the magnetic junctions 100, 200, 200', 200", 300 and/or 300' and PEL 130, 130', 130", 130'", 230, 230', 230", 330, 330', and/or 370 may be used in a magnetic memory. FIG. 11 depicts an exemplary embodiment of one such memory 400. The magnetic memory 400 includes reading/writing column select drivers 402 and 406 as well as word line select driver 404. Note that other and/or different components having another arrangement may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may include one or more of the magnetic junctions 100, 200, 200', 200", 300, and/or 300'. Although one magnetic junction 412 is shown per cell 410, in other embodiments, another number of magnetic junctions 412 may be provided per cell. Thus, the benefits of the magnetic junctions 100, 200, 200', 200", 300, and/or 300' and the PELs 130, 130', 130", 130'", 230, 230', 230", 330, 330" and/or 370 may be realized in the memory 400.

Figure 12:
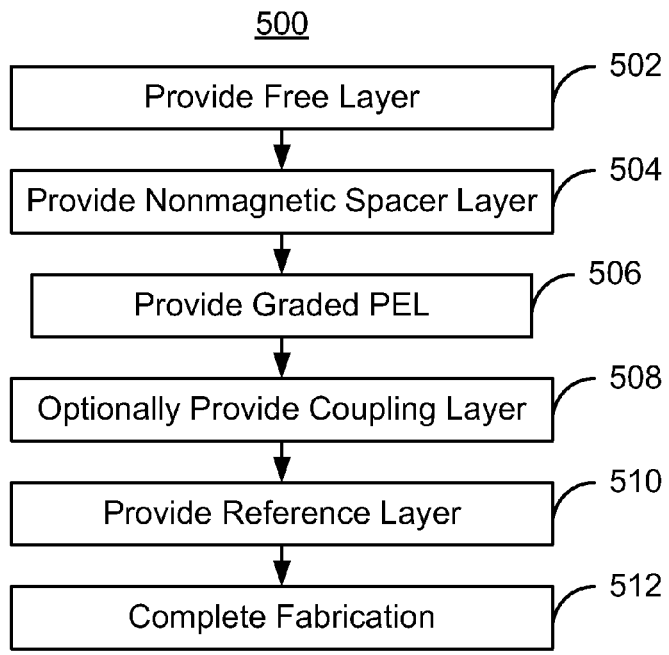
FIG. 12 depicts an exemplary embodiment of a method for providing a magnetic junction including a graded PEL including nonmagnetic insertion layers and switchable via spin transfer.

FIG. 12 depicts an exemplary embodiment of a method 500 for fabricating magnetic substructure. For simplicity, some steps may be omitted, combined, and/or interleaved. The method 500 is described in the context of the magnetic junction 100. However, the method 500 may be used on other magnetic junctions such as the junctions 200, 200', 200", 300, 300' and/or 412. Further, the method 500 may be incorporated into fabrication of magnetic memories. Thus the method 500 may be used in manufacturing a STT-RAM or other magnetic memory. The method 500 may also include providing the seed layer(s) 202 and optional pinning layer (not shown).

The free layer 110 is provided, via step 502. Step 502 may include depositing the desired materials at the desired thickness of the free layer 210. Further, step 502 may include providing a SAF. The nonmagnetic layer 120 is provided, via step 504. Step 504 may include depositing the desired nonmagnetic materials, including but not limited to crystalline MgO. In addition, the desired thickness of material may be deposited in step 504.

The graded PEL 130 is provided, via step 506. Step 506 includes depositing ferromagnetic layers interleaved with nonmagnetic insertion layers of the desired thickness. Thus, the layers depicted in the PELs 130', 130", and/or 130'" are deposited in step 506. Note, however, that at thicknesses on the order of two Angstroms, the layers deposited in step 506 may not be continuous or may have variations in thickness. For example, the nonmagnetic insertion layers formed in step 506 may include overlapping islands and/or open regions analogous to pinholes. With later processing, portions of these nonmagnetic insertion layers may migrate. For example, the magnetic junction 100 may be annealed later in fabrication. The materials such as Ta in the nonmagnetic insertion layers may then migrate. As a result of the annealing-induced migration, the overlapping islands may diffuse to form layers having smaller variations in thickness. The coupling layer 140 may optionally be provided, via step 508. Step 508 may include depositing a Ru layer. In some embodiments, step 508 may be omitted.

The high PMA layer 250 is provided, via step 510. Step 510 may include depositing the desired materials at the desired thickness of the high PMA layer 250. Further, step 510 may include providing a SAF and/or high perpendicular anisotropy multilayers. For example, one or more Co/Pd and/or Co/Pt multilayers may be fabricated in step 510. In addition, other magnetic and/or nonmagnetic materials may also be used in fabricating the high PMA layer in step 510. Steps 506, 508 and 510 may thus be considered to fabricate the reference stack 260.

Fabrication of the magnetic junction 100 is completed, via step 512. Any additional layers, such as layers 365, 370, 380 and 390 may optionally be provided in step 512. Similarly, capping layers or other layer(s) may be provided in step 512. Anneals, setting of the direction of magnetic moments in an external field and/or other processes may also be carried out. Thus, using the method 500, the benefits of the PELs 130/130'/130"/130'"/230/230'/230"/330/330' and magnetic junctions 100, 200, 200', 200", 300 and/or 300' may be achieved.

A method and system for providing a magnetic junction including a reference stack having PEL(s) and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
    a free layer having a free layer magnetic moment perpendicular-to-plane;
    a nonmagnetic spacer layer having a first crystalline orientation,
    a reference stack including a high perpendicular magnetic anisotropy (PMA) layer and a graded polarization enhancement layer (PEL), the nonmagnetic spacer layer residing between the graded PEL and the free layer, the graded PEL being between the high PMA layer and the nonmagnetic spacer layer, the high PMA layer having a magnetic moment perpendicular-to-plane, a second crystalline orientation and a first spin polarization, the graded PEL being adjacent to and magnetically coupled with the high PMA layer, the graded PEL including a plurality of magnetic layers and a plurality of nonmagnetic insertion layers, at least a portion of the PEL having a second spin polarization greater than the first spin polarization and being adjacent to the nonmagnetic spacer layer, the plurality of nonmagnetic insertion layers being configured such that the plurality of magnetic layers are ferromagnetically coupled and such that the first crystalline orientation is decoupled from the second crystalline orientation, each of the plurality of nonmagnetic insertion layers having a thickness, the thickness of each of the plurality of nonmagnetic insertion layers being insufficient for the first crystalline orientation to be decoupled from the second crystalline orientation in the absence of a remaining portion of the plurality of nonmagnetic insertion layers;
    wherein the magnetic junction is configured such that the free layer is switchable between a plurality of stable magnetic states when a write current is passed through the magnetic junction.

2. The magnetic junction of claim 1 wherein a sum of the thickness of each of the plurality nonmagnetic insertion layers being sufficient for diffusion blocking between the reference layer and the nonmagnetic spacer layer, the thickness of each of the plurality of nonmagnetic insertion layers being insufficient for the diffusion blocking between the reference layer and the nonmagnetic spacer layer.

3. The magnetic junction of claim 2 wherein the sum of the thickness is at least four Angstroms.

4. The magnetic junction of claim 2 wherein the thickness is less than three Angstroms.

5. The magnetic junction of claim 4 wherein the thickness is at least two Angstroms.

6. The magnetic junction of claim 1 wherein the graded PEL includes Ta.

7. The magnetic junction of claim 6 wherein each of the plurality of nonmagnetic layers in the PEL consists of Ta.

8. The magnetic junction of claim 1 wherein the high PMA layer includes at least one of a high perpendicular anisotropy multilayer and a high perpendicular anisotropy superlattice.

9. The magnetic junction of claim 8 wherein the at least one of the high perpendicular anisotropy multilayer and the high perpendicular anisotropy superlattice includes at least one of a Co/Pt multilayer, a Co/Pd multilayer, a CoPt superlattice and a CoPd superlattice.

10. The magnetic junction of claim 8 wherein the high PMA layer is a synthetic antiferromagnet including a first magnetic structure, a second magnetic structure and a nonmagnetic layer between the first magnetic structure and the second magnetic structure, at least one of the first magnetic structure and the second magnetic structure including the at least one of the high perpendicular anisotropy multilayer and the high perpendicular anisotropy superlattice.

11. The magnetic junction of claim 1 further comprising:
a nonmagnetic magnetic coupling layer between the high PMA layer and the graded PEL.

12. The magnetic junction of claim 1 wherein one of the plurality of nonmagnetic insertion layers adjoins the high PMA layer.

13. The magnetic junction of claim 1 wherein the free layer further includes at least one of a high perpendicular anisotropy multilayer and a high perpendicular anisotropy superlattice.

14. The magnetic junction of claim 1 wherein the nonmagnetic spacer layer includes MgO.

15. The magnetic junction of claim 1 wherein a layer of the plurality of magnetic layers closest to the nonmagnetic spacer layer has the second spin polarization.

16. The magnetic junction of claim 1 wherein the graded PEL includes CoFeB.

17. The magnetic junction of claim 16 wherein the plurality of magnetic layers includes a CoFeB layer having not more than forty atomic percent B, the CoFeB layer adjoining the nonmagnetic spacer layer.

18. The magnetic junction of claim 1 wherein each of the plurality of nonmagnetic insertion layers in the graded PEL is amorphous.

19. A magnetic junction for use in a magnetic device comprising:
a free layer having a free layer magnetic moment perpendicular-to-plane;
a crystalline MgO layer;
a reference stack including a high perpendicular magnetic anisotropy (PMA) layer and a graded polarization enhancement layer (PEL), the crystalline MgO layer residing between the graded PEL and the free layer, the graded PEL being adjacent to and magnetically coupled with the high PMA layer, the graded PEL being between the crystalline MgO layer and the high PMA layer, the high PMA layer having a reference layer magnetic moment perpendicular-to-plane and a first spin polarization, the graded PEL layer being adjacent to and magnetically coupled with the high PMA layer, the graded PEL including a plurality of magnetic layers and a plurality of Ta insertion layers, at least a layer of the plurality of magnetic layers having a second spin polarization greater than the first spin polarization and including CoFeB having not more than twenty atomic percent B, each of the plurality of Ta insertion layers having a thickness of less than three Angstroms, at least the layer being adjacent to the crystalline MgO layer, a sum of the thickness of each of the plurality Ta insertion layers being sufficient for diffusion blocking between the high PMA layer and the crystalline MgO layer and being at least four Angstroms, the thickness of each of the plurality of Ta insertion layers being insufficient for the diffusion blocking between the reference layer and the crystalline MgO layer;
wherein the magnetic junction is configured such that the free layer is switchable between a plurality of stable magnetic states when a write current is passed through the magnetic junction.

20. A magnetic memory comprising:
a plurality of magnetic storage cells, each of the plurality of magnetic storage cells including at least one magnetic junction, the at least one magnetic junction including a free layer, a nonmagnetic spacer layer and a reference stack, the free layer having a free layer magnetic moment perpendicular-to-plane, the nonmagnetic spacer layer having a first crystalline orientation, the nonmagnetic spacer layer being between the reference stack and the free layer, the reference stack including a high perpendicular magnetic anisotropy (PMA) layer and a graded polarization enhancement layer (PEL), the graded PEL residing between the high PMA layer and the nonmagnetic spacer layer, the high PMA layer having a magnetic moment perpendicular-to-plane, a second crystalline orientation and a first spin polarization, the graded PEL being adjacent to and magnetically coupled with the high PMA layer, the graded PEL including a plurality of magnetic layers and a plurality of nonmagnetic insertion layers, at least a portion of the PEL having a second spin polarization greater than the first spin polarization and being adjacent to the nonmagnetic spacer layer, the plurality of nonmagnetic insertion layers being configured such that the plurality of magnetic layers are ferromagnetically coupled and such that the first crystalline orientation is decoupled from the second crystalline orientation, the magnetic junction being configured such that the free layer is switchable between a plurality of stable magnetic states when a write current is passed through the magnetic junction, each of the plurality of nonmagnetic insertion layers having a thickness, the thickness of each of the plurality of nonmagnetic insertion layers being insufficient for the first crystalline orientation to be decoupled from the second crystalline orientation in the absence of a remaining portion of the plurality of nonmagnetic insertion layers; and
a plurality of bit lines coupled with the plurality of magnetic storage cells.

21. The magnetic memory of claim 20 wherein each of the plurality of nonmagnetic insertion layers has a thickness, a sum of the thickness of each of the plurality nonmagnetic insertion layers being sufficient for diffusion blocking between the reference layer and the nonmagnetic spacer layer, the thickness of each of the plurality of nonmagnetic insertion layers being insufficient for the diffusion blocking between the reference layer and the nonmagnetic spacer layer.

22. The magnetic memory of claim 21 wherein the sum of the thickness is at least four Angstroms.

23. The magnetic memory of claim 21 wherein the thickness is less than three Angstroms.

24. The magnetic memory of claim 23 wherein the thickness is at least two Angstroms.

25. The magnetic memory of claim 20 wherein the graded PEL includes Ta.

26. The magnetic memory of claim 25 wherein each of the plurality of nonmagnetic insertion layers in the graded PEL consists of Ta.

27. The magnetic memory of claim 20 wherein the high PMA layer includes at least one of a high perpendicular anisotropy multilayer and a high perpendicular anisotropy superlattice.

28. The magnetic memory of claim 27 wherein the at least one of the high perpendicular anisotropy multilayer and the high perpendicular anisotropy superlattice includes at least one of a Co/Pt multilayer, a Co/Pd multilayer, a CoPt superlattice and a CoPd superlattice.

29. The magnetic memory of claim 28 wherein the high PMA layer is a synthetic antiferromagnet including a first magnetic structure, a second magnetic structure and a nonmagnetic layer between the first magnetic structure and the second magnetic structure, at least one of the first magnetic structure and the second magnetic structure including the at least one of the high perpendicular anisotropy multilayer and the high perpendicular anisotropy superlattice.

30. The magnetic memory of claim 20 further comprising:
a nonmagnetic magnetic coupling layer between the high PMA layer and the PEL.

31. The magnetic memory of claim 20 wherein one of the plurality of nonmagnetic insertion layers adjoins the high PMA layer.

32. The magnetic memory of claim 20 wherein the free layer further includes at least one of a high perpendicular anisotropy multilayer and a high perpendicular anisotropy superlattice.

33. The magnetic memory of claim 20 wherein the nonmagnetic spacer layer includes MgO.

34. The magnetic memory of claim 20 wherein the graded PEL includes CoFeB.

35. The magnetic memory of claim 34 wherein the plurality of magnetic layers includes a CoFeB layer having not more than forty percent B, the CoFeB layer adjoining the nonmagnetic spacer layer.

36. A method for providing a magnetic junction for use in a magnetic device comprising:
providing a free layer having a free layer magnetic moment perpendicular-to-plane;
providing a nonmagnetic spacer layer having a first crystalline orientation,
providing a reference stack, the step or providing the reference stack including the steps of
providing a high perpendicular magnetic anisotropy (PMA) layer, the high PMA layer having a magnetic moment perpendicular-to-plane, a second crystalline orientation and a first spin polarization; and
providing a graded polarization enhancement layer (PEL), the nonmagnetic spacer layer residing between the graded PEL and the free layer, the graded PEL residing between the high PMA layer and the nonmagnetic spacer layer, the graded PEL being adjacent to and magnetically coupled with the high PMA layer, the graded PEL including a plurality of magnetic layers and a plurality of nonmagnetic insertion layers, at least a portion of the PEL having a second spin polarization greater than the first spin polarization and being adjacent to the nonmagnetic spacer layer, the plurality of nonmagnetic insertion layers being configured such that the plurality of magnetic layers are ferromagnetically coupled and such that the first crystalline orientation is decoupled from the second crystalline orientation, each of the plurality of nonmagnetic insertion layers having a thickness, the thickness of each of the plurality of nonmagnetic insertion layers being insufficient for the first crystalline orientation to be decoupled from the second crystalline orientation in the absence of a remaining portion of the plurality of nonmagnetic insertion layers;
wherein the magnetic junction is configured such that the free layer is switchable between a plurality of stable magnetic states when a write current is passed through the magnetic junction.

\* \* \* \* \*